United States Patent [19]
Nitescu

[11] Patent Number: 5,348,497
[45] Date of Patent: Sep. 20, 1994

[54] HIGH VOLTAGE VACCUM FEED-THROUGH ELECTRICAL CONNECTOR

[75] Inventor: Petru N. Nitescu, Fremont, Calif.

[73] Assignee: Applied Materials, Inc., Santa Clara, Calif.

[21] Appl. No.: 931,096

[22] Filed: Aug. 14, 1992

[51] Int. Cl.⁵ .......................................... H01R 13/24
[52] U.S. Cl. ................................... 439/824; 411/373
[58] Field of Search ..................... 439/289, 824, 700; 204/286, 297 R, 297 M; 411/222, 431, 377, 374, 373, 910

[56] References Cited

U.S. PATENT DOCUMENTS

| | | | |
|---|---|---|---|
| 2,047,623 | 7/1936 | Felts | 439/696 |
| 2,858,518 | 10/1958 | Chrystie et al. | 439/259 |
| 3,771,110 | 11/1973 | Reed | 439/824 |
| 4,116,799 | 9/1978 | Gosger et al. | 204/297 R |
| 4,394,096 | 7/1983 | Stevens | 411/910 |
| 4,487,661 | 12/1984 | Barraud et al. | 204/297 M |
| 4,703,986 | 11/1987 | McCormick | 439/607 |
| 4,842,683 | 6/1989 | Cheng et al. | 156/345 |

FOREIGN PATENT DOCUMENTS 813559 3/1981 U.S.S.R. ............................ 439/824

OTHER PUBLICATIONS

Bulletin Servometer Corp for Gold Plated Bellows Contact Springs, 2 pp.
Belleville Spring Washer brochure.

*Primary Examiner*—Neil Abrams
*Attorney, Agent, or Firm*—Birgit E. Morris

[57] ABSTRACT

A high voltage contact assembly comprising two dielectric housing members adapted for fastening together, the first dielectric housing member having a first conductor inserted therein, the second dielectric housing member having a second conductor inserted therein and spring means sandwiched between the first conductor and the second conductor, the second conductor fastened to a high voltage cable member, such that, when the dielectric housing members are fastened together, the first conductor member extends above the surface of the first housing member. The contact assembly of the invention is useful for mounting in a base plate support for an electrostatic chuck in an etch chamber.

10 Claims, 5 Drawing Sheets

5,348,497

HIGH VOLTAGE VACCUM FEED-THROUGH ELECTRICAL CONNECTOR

This invention relates to a high voltage (hereinafter vacuum feed-through electrical connector assembly. More particularly, this invention relates to a HV connector assembly useful in a vacuum reaction chamber to connect an external HV source to a fixture inside the chamber.

BACKGROUND OF THE INVENTION

During semiconductor processing of semiconductor substrates, such as silicon wafers in a vacuum chamber, it is necessary to place the substrate on a cathode support during processing, such as etching or chemical vapor deposition. The substrates can be held in place with contact rings or fingers around its periphery to hold the substrate firmly in place on the cathode support. However, mechanical parts such as rings or fingers interfere with processing around the edges of the substrate, and they can generate particles in the reaction chamber during raising and lowering of the rings or fingers.

Electrostatic cathode supports or chucks have also been suggested. These chucks or cathode supports are connected to an external HV power source external to the vacuum chamber in order for a dielectric coated conductive film on the chuck to produce an electrostatic charge on the surface of the chuck sufficient to maintain the substrate in place during processing. However, in practice implementation of these chucks present certain difficulties. The cathode or chuck is itself supported on a fixed base, generally of aluminum, which is situated on the bottom wall of the reaction chamber. This base must contain a plurality of openings including a large central opening for a lift mechanism to move the wafer down onto the chuck into its processing position in the chamber and up again after processing is complete, and in addition the base contains openings for an RF power source line, a plurality of water and gas (helium) lines for cooling the base, cathode or chuck and the substrate supported thereon during processing. When it is desired to add a HV line to the chuck, still another opening must be made, which must compete for space in the cathode base.

Further, it has been the practice to insert the HV power line through the base with an extension for the HV cable. When the reaction chamber is disassembled, as during cleaning operations or repairs, care must be taken not to damage the protruding HV line. Since the base is quite heavy, this is no small feat.

When a two part HV connector is used, such as a flange mounted or jam nut mounted receptacle, suitably a standard circular MIL-C-5015 receptacle, the two parts must be connected after the reaction chamber is assembled, necessitating enough room in the bottom of the base to assure that a tight connection is made along with a vacuum seal, again competing for space in the base with other required channels and openings. Further, a portion of the metal receptacle is in the vacuum chamber in a vacuum environment, which can cause arcing during processing, as well as the generation of particles within the chamber, Thus a HV connector that provides reliable contact between an outside source of HV power and a reactor part, one that does not take up much space in the reaction chamber base, that does not generate particles in the chamber, nor cause arcing during processing, and that can be permanently mounted in the base so that it does not interfere with disassembly or cleaning of the reaction chamber, would be highly desirable.

SUMMARY OF THE INVENTION

The invention comprises a HV connector assembly comprising a first and second conductive metal portion sandwiching a spring portion, held together in a two part dielectric jig that provides easy assembly of the connector and provides dielectric isolation of the connector and the part to which it is mounted. A HV cable is affixed to the second conductive metal portion prior to final assembly of the connector assembly.

DETAILED DESCRIPTION OF THE INVENTION

Figure 1:
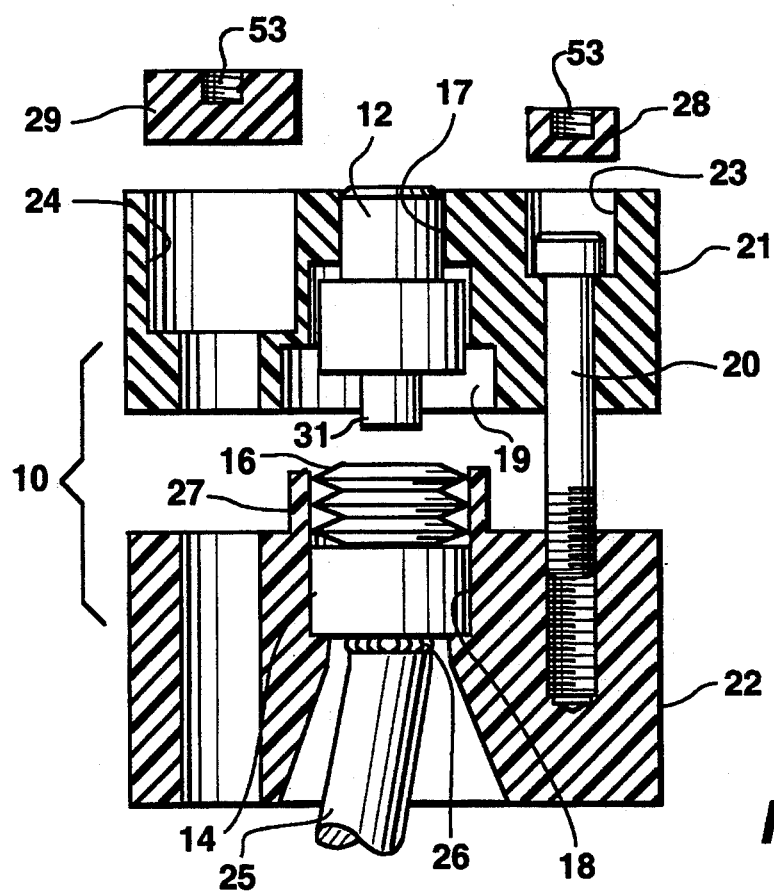
FIG. 1 is an exploded view of the parts of the novel connector and jig of the invention.

The self-contained electrical connector of the invention can be described with reference to FIG. 1, which is an exploded view of the disassembled contact and its dielectric jig 10.

A first conductor part 12 is a shaped metal part made of a conductive metal, such as copper and the like. Copper is preferred because of its highly conductive properties. A second conductor part 14 is a like shaped conductive part. The first conductor part 12 and the second conductor part 14 sandwich a spring, which can be, for example, a plurality of spring washers 16 which are stacked so as to provide the desired degree of spring resilience. The total spring load able to be generated by the washers varies with their number, dimensions and material properties. The spring washers 16 can be stacked in series, thereby increasing the deflection in proportion to the number of stacked washers, whereby the load remains about the same. The washers are also made of a conductive metal, one that has the required resilient strength and spring characteristics, suitably of beryllium copper alloy. In a particular embodiment, 7-8 washers are alternately assembled in back to back and front to front relation.

The conductive metal parts 12 and 14 are inserted into openings 17 and 18 formed in first and second dielectric jig members 21 and 22 respectively. The dielectric jig members 21 and 22 can be made of plastic for example, suitably a thermocompression or molded plastic part which is readily manufacturable. A plastic material such as a polyimide or polysulfone, suitably Vespel SP-1 of the dupont de Nemours Company can be employed. In addition to openings 17 and 18 in the jigs 21 and 22 for insertion of the conductive metal parts 12 and 14, the jigs 21 and 22 also can contain other openings 23, as for the insertion of fastening means to connect the two parts 21 and 22 together, as well as openings 24 for fastening the assembled contact to a reactor base or other part.

The first jig member 21 is fitted with an opening 17 for insertion therein of the first conductor part 12. The first jig member 21 is sized so that the first conductor part 12 extends slightly above the surface of the upper jig wall 23 when the connector 10 is fully assembled. In a preferred embodiment, the exposed portion of the first conductive part 12 has a slightly curved or chamfered surface to avoid damage to the chuck or its contact during assembly of the reaction chamber.

The second jig member 22 is fitted with an opening 18 for insertion therein of the second conductor part 14, to the bottom of which is fastened a HV cable 25. Suitably the cable 25 can be fastened to the second conductor 14 by means of a soldered joint 26. In a preferred embodiment, the bottom of the opening 18 is shaped, as in an inverted cone, so that the cable is not stressed or damaged by bending or moving out of center to avoid other features built into the cathode base.

The washers 16 are next assembled within an extension of the upper walls 27 of the second jig member 22. When assembled so that the upper wall 26 is fitted into a corresponding opening 19 in the first jig member 21 and contact is made to the first conductor part 12, the conductor parts 12 and 14 are compressed against the washers 16, thereby providing an upward spring force of the first conductor part 12, and ensuring good contact between it and the part to which it is to conduct a HV current flow.

The design characteristics of the washers 16 can affect the spring characteristics of the assembled connector. The use of thicker washers 16 will yield a stiffer spring. The inside and outside diameters will also affect the spring constant of each washer, and thus the spring constant of the entire spring, Suitably the washers 16 have an outside diameter of 0.187 inch and an inside diameter of 0.093 inch, a thickness of 0.010 inch and a non-compressed height of 0.015 inch.

To assemble the contact of the invention, the second conductor member 14 is soldered to the HV cable 25 and inserted into the opening 18 of the second jig member 22. The washers 16 are stacked within the extension wall 27 of the second jig member 22 front-to-front and back-to-back, alternately. Next the first conductor part 12 is placed on top of the stacked spring washers 16 and guided inside the washers' inner diameter through a pilot peg 31 extending at the bottom of the first conductor part 12. The extension wall 27 is then fitted into the opening 19 in the first jig member 21. The two jig members 21 and 22 are then fastened together, as by screws or threaded pins 20, inserted into openings 23. A sufficient number of washers 16 are inserted so that the top of the first conductor member 12 extends above the surface of the first jig member 21, suitably by about 0.018–0.023 inch.

The distance between the two conductor parts 12 and 14 without any force exerted by the spring may vary between 0.095 inch and 0.115 inch. If the non-spring-loaded distance between the moveable first conductor part 12 and the fixed second conductor part 14 is between 0.095 and 0.105 inch, the spring is best assembled with seven washers 16, which will yield a compressive force ranging from 7.9 to 9.75 lbs. If the non-spring-loaded distance between the moveable first conductor part 12 and the fixed second conductor part 14 is between 0.105 and 0.115 inch, the spring is best assembled with 8 washers 16 to yield a compressive force ranging from about 6–9.5 lbs.

The washers are preferably stacked so that the top washer is head up and base down to best hold the peg 31 of the movable conductor part 12.

After assembly, the top of the screw openings 23 are preferably filled with dielectric plugs or caps 28, generally of the same material as the jig members 21 and 22, to reduce the danger of arcing in the reaction chamber. Additional fastening members (not shown) may be inserted into openings 24 that mount the connector 10 to the cathode base and are similarly preferably filled in with dielectric caps 29. The caps 29 have blind threaded holes 53 to aid in extracting them from their respective openings when the connector assembly 10 is taken apart. These extraction holes 53 are suitably #0–80 in size. When the caps 28 and 29 are used, the only exposed metal on the top surface of the assembled contact is the first conductor part 12.

The following discussion is directed to mounting the contact of the invention in a reactor base for supporting a cathode or chuck that is able to support a substrate to be processed by electrostatic attraction. However, this utility is illustrative only and the contact of the invention can be used with other equipment as needed. The connector of the invention can be made very small, so that it does not interfere with other equipment and lines mounted or machined in the base. For example, the dimensions of the connector 10 can have an outside diameter of about 0.600 inch and a height of about 0.654 inch.

Figure 2:
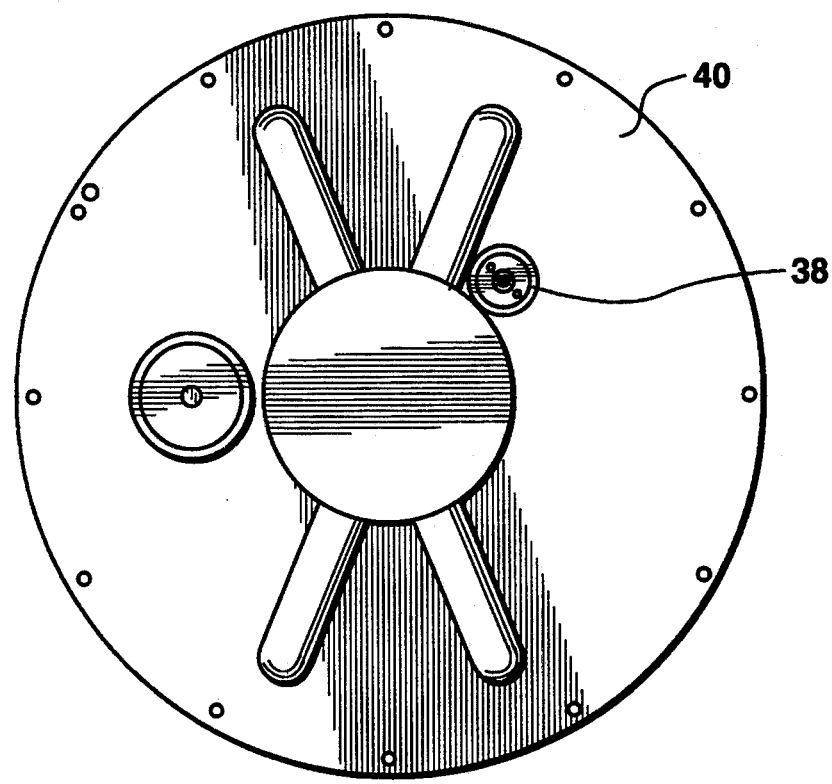
FIG. 2 is a top view of a unipolar electrostatic chuck etch chamber base having the contact and jig of the invention mounted therein.

FIG. 2 is a top view of a base 40 for a unipolar electrostatic chuck cathode etch chamber having an assembled connector 38 of the invention inserted therein.

Figure 3:
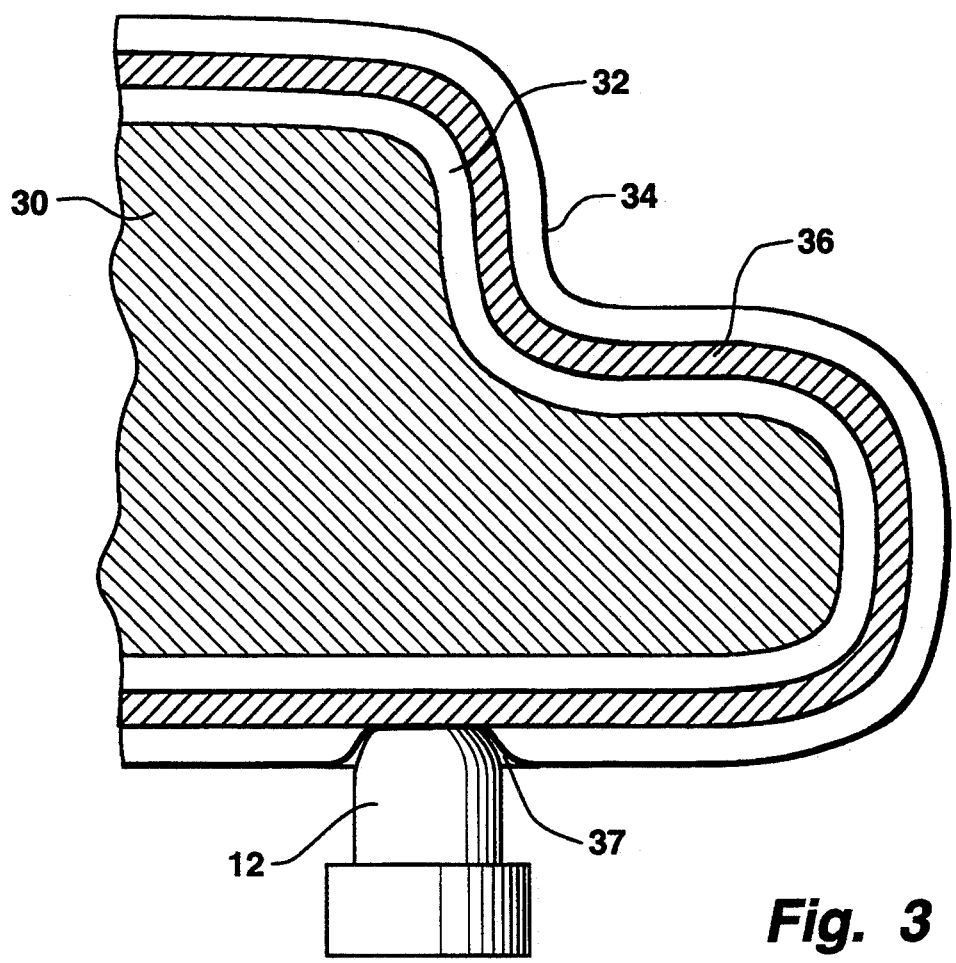
FIG. 3 is a partial cross sectional view of a base for a unipolar electrostatic chuck having a contact of the invention mounted therein.

FIG. 3 illustrates the use of a contact of the invention to contact an overlying unipolar electrostatic chuck in an etch reactor. The pedestal 30, which can be made of aluminum for example, is covered by a sandwich of dielectric layers, such as Kapton foil layers 32 and 34 about 0.1 mm thick about a layer of conductive copper foil 36, also about 0.1 mm thick. The tri-layer electrostatic film 32, 34 and 36, is adhered to the pedestal 30 via a non-outgassing, good heat conductance epoxy bonding adhesive. A small opening 37 through the outer Kapton layer 34 to the copper foil layer 36 is made to provide electrical contact. The pedestal 30 is employed as the cathode support for the substrate to be processed in an etch reactor (not shown).

The spring loaded assembled contact of the invention 38 is inserted into a suitable opening in a base which supports the pedestal 30. The pedestal 30 is mounted onto the cathode base so that the opening 37 to the copper foil layer 36 is opposite the protruding head 12 of the assembled contact. When the pedestal 30 is mounted onto the base via a number of screws located on a bolt circle close to the edge, it depresses the first conductor 12 which in turn depresses the washers 16 in the assembled contact 38, ensuring excellent electrical connection between the external HV power source (not shown) and the pedestal 30. Thus positive dc voltage, typically about 300-2000 volt dc, is carried between the connector assembly 38 and the electrode of the pedestal 30, thereby producing a unipolar electrostatic chuck.

Figure 4:
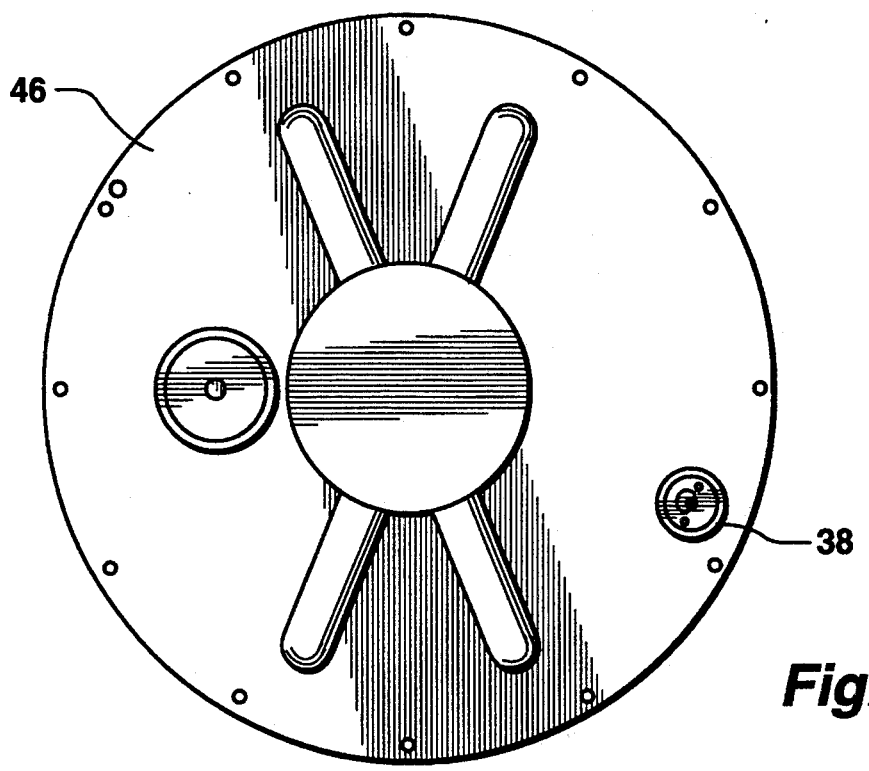
FIG. 4 is a top view of a bipolar electrostatic chuck etch chamber base having the contact and jig of the invention mounted therein.

FIG. 4 is a top view of a base 46 for a bipolar chuck etch chamber having a connector 38 of the invention inserted therein.

Figure 5:
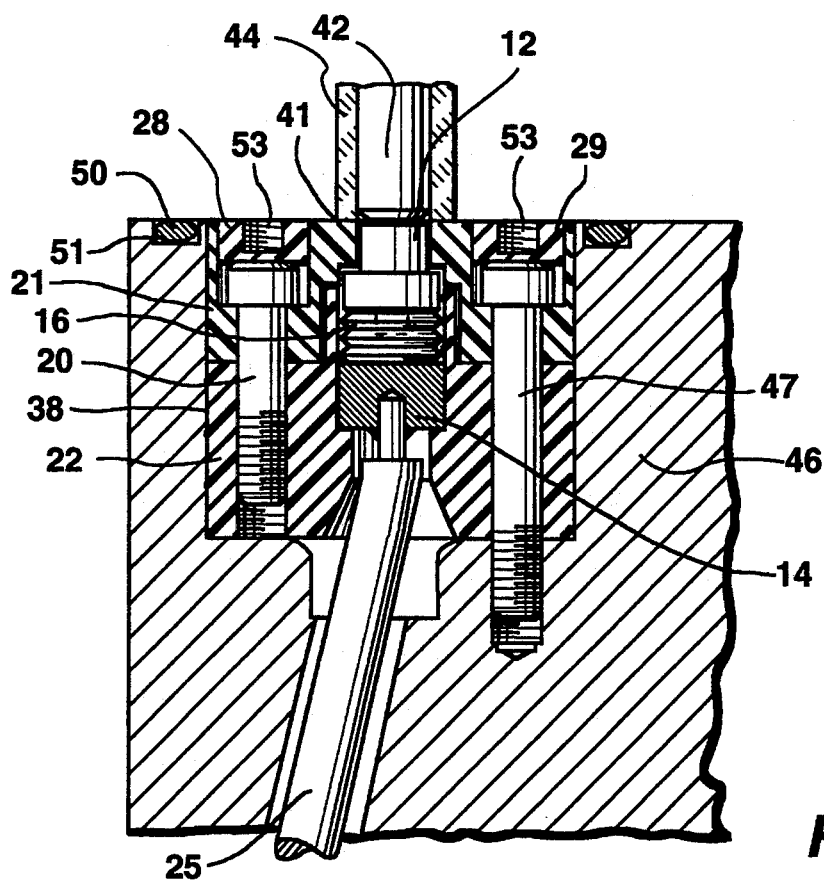
FIG. 5 is a partial cross sectional view of a pedestal for a bipolar electrostatic chuck having a contact of the invention in contact therewith.
Figure 6:
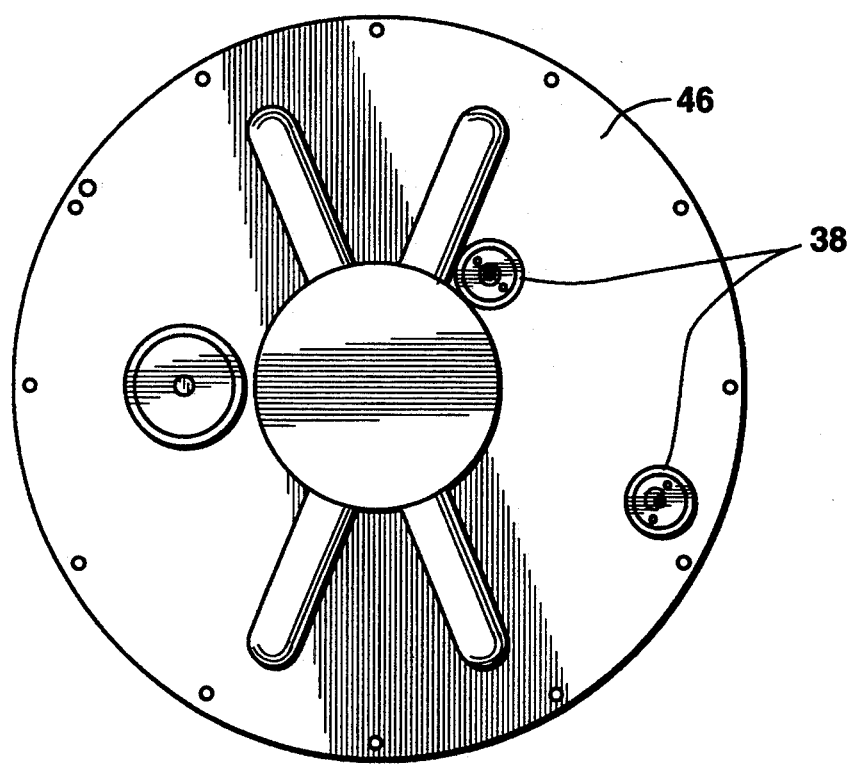
FIG. 6 is a top view of a universal electrostatic chuck etch chamber base having two contacts and jigs of the invention mounted therein.

As shown in FIG. 5, the contact 38 of the invention can be employed as a HV electrical connection to a bipolar electrostatic chuck. The cathode in this case has a dual conductive metal terminal 42 extending to the bottom of the pedestal 44. The assembled contact of the invention 38 is mounted in the base support 46 for the pedestal 44. As shown FIG. 5, the metal terminals 42 make contact with the first conductor member 12, which is inserted and mounted in the cathode base 46.

Caps 29 are inserted above the screw holes after fastening the contact 38 to the base 40 or 46. These caps 29 are of a size such that they can be simply dropped into the openings to avoid electrical breakdown between the screws or fasteners 47 and HV energized parts.

Figure 7:
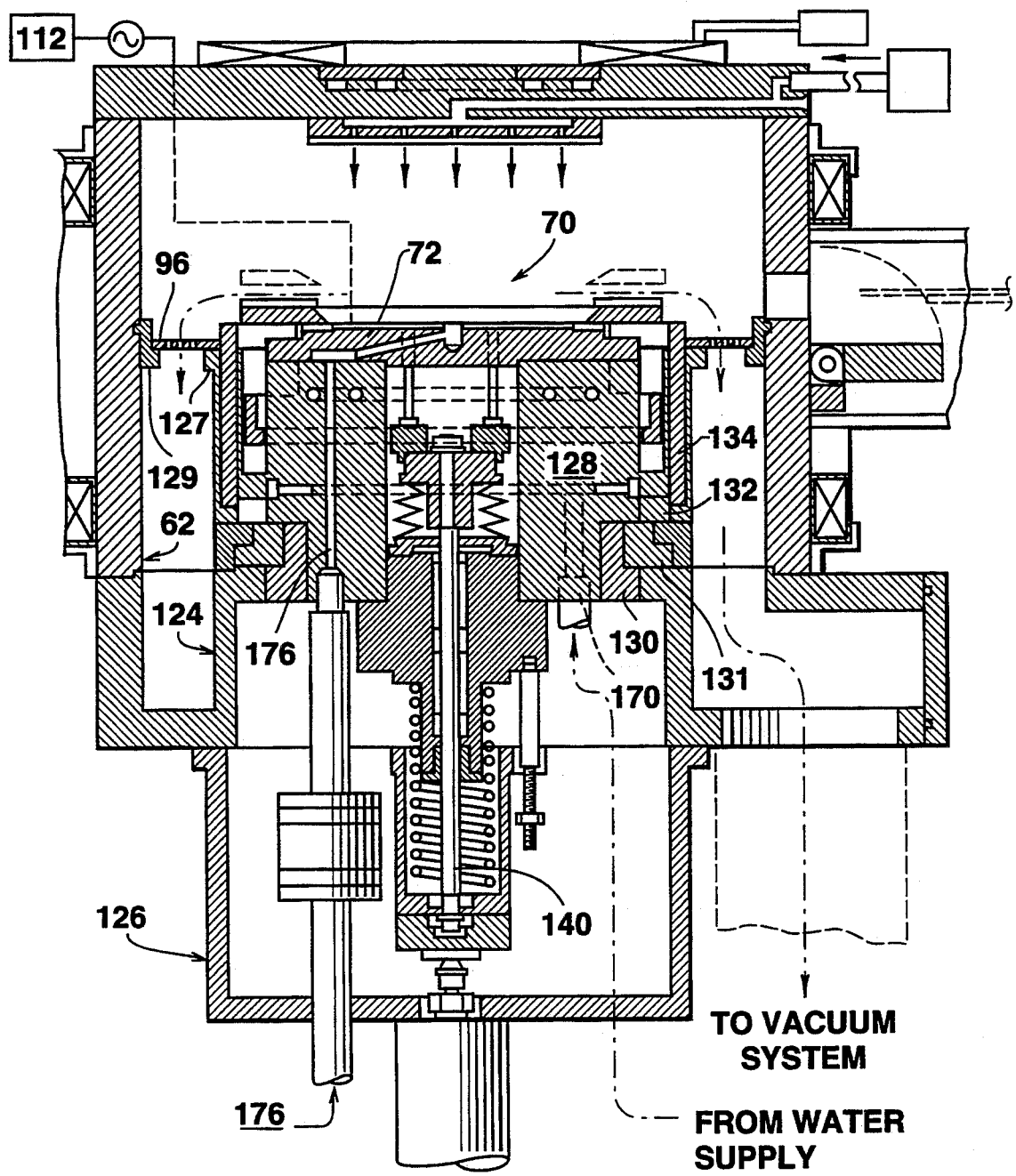
FIG. 7 is a cross sectional view of a prior art etch chamber including a powered pedestal therein.

FIG. 7 is a cross sectional view of a prior art etch chamber in which the present connector assembly can be advantageously employed, somewhat modified to delete numerals to features not of interest here. FIG. 7 is taken from U.S. Pat. No. 4,842,683, assigned to the present assignee, which illustrates a vacuum chamber in which the pedestal of FIG. 3 can be used.

Referring to FIG. 7, the pedestal assembly 70 comprises a generally cylindrical wall structure 124 that is mounted inside the housing 62, and a cylindrical bottom housing 126 that is mounted to, and extends below, the bottom of the housing 62. The annular exhaust plate 96 is mounted peripherally about the housing 124 on bosses 127 and 129. The RF powered pedestal/cathode 72 is mounted on a generally cylindrical base member 128 that is mounted to the grounded housing by mating annular insulator members 130-134. Shaft lift mechanism 140 provides for vertical movement of the RF powered pedestal 72. An external power supply 112 is connected to the pedestal 72. A cold liquid inlet for cooling of the base is shown at 170. Gas cooling is also provided through gas inlet passageway 176. Thus FIG. 7 illustrates several of the inlets and openings normally found in a pedestal for an etch chamber.

Figure 8:
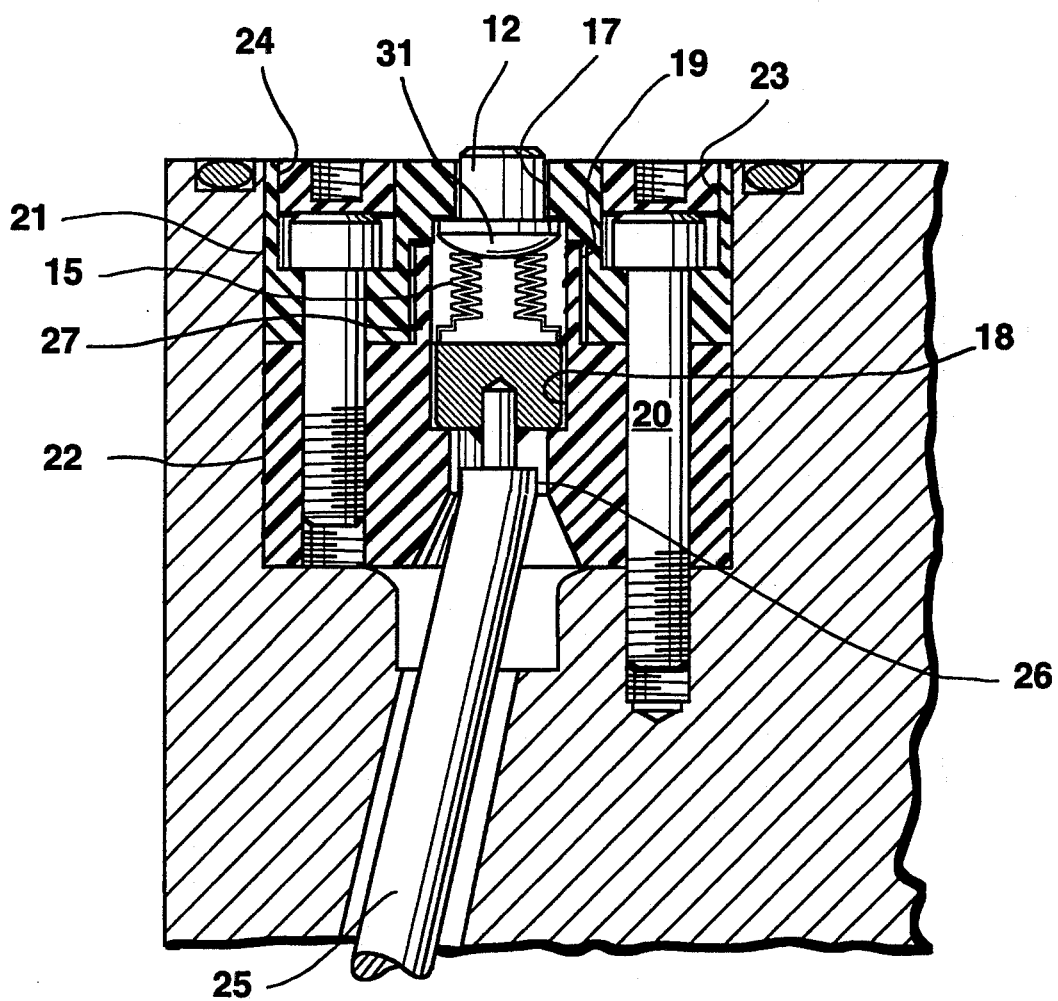
FIG. 8 is a an alternate embodiment of the present connector and assembled jig of the invention employing a bellows spring means.

FIG. 8 illustrates a connector assembly of the invention which is similar to the contact of FIG. 1 as assembled, except that a gold plated bellows contact spring 15 is shown in place the spring washer assembly 16 shown in FIG. 1. Like numerals for like parts are otherwise the same as in FIG. 1. These bellows contact springs are commercially available from Servometer Corporation, Cedar Grove, N.J.

By mounting the connector of the invention into a base support of a vacuum chamber, the connector itself and a soldered electrical cable need not be under vacuum or indeed inside the vacuum chamber at all. After mounting the HV connector into the base, a simple O-ring seal 50 about the fastened connector of the invention provides full vacuum integrity to be maintained in the vacuum chamber. A suitable O-ring is Parker catalog number 2-017 and is made from an elastomer such as VITON V884-75 available from Bay Seal Corporation. The O-ring fits into a corresponding groove or bore 51 machined into the cathode base 46, which has an outside diameter of 0.820 inch and a height of 0.045 inch. This seal is much simpler and less expensive than conventional flange mounted or jam nut mounted receptacles discussed hereinabove.

An additional advantage of the present assembled connector 38 is that it can remain in the base when the vacuum chamber is disassembled for an indefinite number of pedestal chamber replacements or vacuum chamber cleaning operations.

Although the connector assembly of the invention has been described in terms of a specific embodiment, various changes will be obvious to one skilled in the art and are meant to be encompassed herein. For example, the spring washers can be replaced by other spring means, such as a leaf spring, coil spring or bellows contact springs. For example, bellows contact springs are commercially available that have an outside diameter of 0.125 inch, overall length of 0.197-0.160 inch: length of 0.122-0.142 inch a maximum compression stroke of from 0.060-0.072 inch and minimum force at full compression of about 3.5-4.0 oz.

In addition, soldering of the HV cable to the bottom of the second conductor member can be replaced by other fastening means. Further, although the HV connector of the invention is illustrated in use as a means to supply HV DC current to an electrostatic chuck, the connector can also be employed to connect power to other parts, such as a thermocouple embedded in the chuck and the like. The invention is meant to be limited only by the appended claims.

I claim:

1. A high voltage vacuum feed-through connector assembly comprising:
    a) a first conductor member inserted into a dielectric first housing member;
    b) a second conductor member inserted into a dielectric second housing member;
    c) a conductive spring sandwiched between the first and second conductor members;
    d) a high voltage cable fastened to said second conductor member;
    e) two or more fasteners for joining said first and second housing members together so that, when fastened, said first conductor member extends above the surface of the first housing member, wherein said dielectric second housing member has a cone-shaped opening for said high voltage cable.

2. A connector assembly according to claim 1 wherein said spring comprises a plurality of spring washers.

3. A connector assembly according to claim 1 wherein said spring comprises a bellows spring.

4. A connector assembly according to claim 2 wherein said conductor members are made of copper and said washer springs are made of copper beryllium alloy.

5. A connector assembly according to claim 1 wherein said fasteners are screws inserted into sized openings in said dielectric housing members.

6. A connector assembly according to claim 1 wherein said fasteners are screws inserted into sized openings in said dielectric housing members and wherein dielectric caps are inserted above the screw fasteners.

7. A connector assembly according to claim 6 wherein said dielectric caps have extraction blind threaded holes therein.

8. A reaction chamber base having a high voltage connector assembly of claim 1 mounted therein.

9. In a vacuum chamber for etching a substrate having a cathode base for supporting an electrostatic chuck, said chuck having an insulated electrode surface for supporting the substrate to be etched at one end, and a chuck electrical contact for connecting an external source of HV power at the other end of said chuck, the improvement comprising a vacuum feed-through high voltage connector assembly of claim 1 mounted in said base opposite said chuck contact.

10. In a vacuum chamber for etching a substrate having a bipolar electrostatic chuck, said chuck having two terminals respectively connected to the positive and negative electrodes of a HV source, the improvement comprising two high voltage connector assemblies of claim 1 mounted in said base opposite said terminals.

* * * * *